United States Patent
Hikita et al.

(10) Patent No.: US 7,074,882 B2
(45) Date of Patent: Jul. 11, 2006

(54) POLYIMIDE RESIN FOR ELECTRICAL INSULATING MATERIAL

(75) Inventors: Takami Hikita, Ibaraki (JP); Hisae Sugihara, Ibaraki (JP); Amane Mochizuki, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 10/882,304

(22) Filed: Jul. 2, 2004

(65) Prior Publication Data

US 2005/0004323 A1    Jan. 6, 2005

(30) Foreign Application Priority Data

Jul. 4, 2003   (JP)   ............. P.2003-191898
Apr. 14, 2004  (JP)   ............. P.2004-118715

(51) Int. Cl.
*C08G 73/10*   (2006.01)
*C08G 69/28*   (2006.01)

(52) U.S. Cl. ............ 528/353; 528/125; 528/126; 528/128; 528/172; 528/173; 528/174; 528/176; 528/179; 528/185; 528/188; 528/220; 528/229; 528/350

(58) Field of Classification Search ......... 528/170, 528/353, 125, 126, 128, 172–174, 176, 179, 528/185, 188, 220, 229, 350
See application file for complete search history.

(56) References Cited

U.S. PATENT DOCUMENTS

| | | | |
|---|---|---|---|
| 3,847,867 A | 11/1974 | Heath et al. | |
| 4,746,561 A | 5/1988 | Kundinger et al. | |
| 5,206,340 A * | 4/1993 | Tsutsumi et al. | ........... 528/353 |
| 5,264,545 A | 11/1993 | Blum et al. | |
| 5,328,979 A | 7/1994 | Harris et al. | |
| 6,020,456 A * | 2/2000 | Brunelle et al. | ............ 528/353 |
| 6,492,030 B1 | 12/2002 | Hashimoto et al. | |
| 6,500,904 B1 * | 12/2002 | Hayes | ........................ 525/419 |

FOREIGN PATENT DOCUMENTS

| | | |
|---|---|---|
| EP | 0 361 415 A1 | 4/1990 |
| EP | 1 327 515 A1 | 7/2003 |
| JP | 5-156159 A | 6/1993 |
| JP | 5-179140 A | 7/1993 |
| JP | 2001-151935 A | 6/2001 |

OTHER PUBLICATIONS

European Search Report dated Nov. 16, 2004.

* cited by examiner

*Primary Examiner*—P. Hampton Hightower
(74) *Attorney, Agent, or Firm*—Sughrue Mion, PLLC

(57) ABSTRACT

The present invention provides a polyimide resin for an electrical insulating material which comprises a polyimide resin having a repeating unit represented by general formula (I):

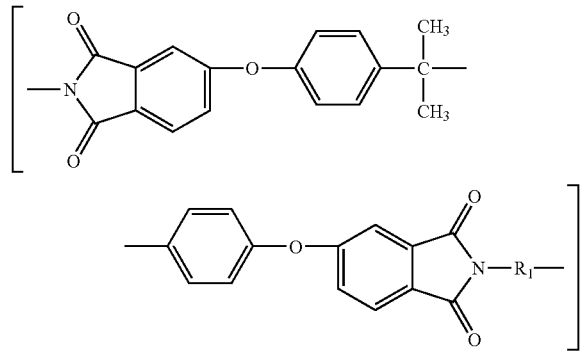

wherein $R_1$ represents a bivalent organic group.

6 Claims, No Drawings

POLYIMIDE RESIN FOR ELECTRICAL INSULATING MATERIAL

FIELD OF THE INVENTION

The present invention relates to a polyimide resin for electrical insulating materials. More particularly, the invention relates to a polyimide resin which has a low relative permittivity and a low dielectric dissipation factor in combination with high heat resistance and is especially suitable for use as an insulating material in wiring circuit boards for electronic appliances operated at high frequencies.

BACKGROUND OF THE INVENTION

The signal frequency zones for information/communication appliances such as PHS's and cell phones and the clock frequencies for computer CPU's have reached the GHz zone in recent years. The trend toward the use of higher frequencies is significant.

In general, dielectric loss for an electrical signal in a wiring circuit is proportional to the product of the square root of the relative permittivity of the insulator used for the wiring circuit, the dielectric dissipation factor of the insulator, and the frequency of the signal to be used. Because of this, the higher the frequency of the signal is, the larger the dielectric loss is. Since dielectric dissipation factor attenuates electrical signals to impair reliability of the signals, it is necessary to use an insulating material having a low relative permittivity and a low dielectric dissipation factor.

Polyimide resins have generally been used extensively as insulating layers in wiring circuit boards, such as insulating base layers and insulating cover layers. In particular, polyetherimides are in frequent use as insulating materials for IC boards and printed wiring boards because they are excellent in heat resistance, electrical insulating properties, mechanical properties, etc. (see, for example, Patent Document 1 specified below).

However, most of the known polyetherimides are relatively high in relative permittivity and dielectric dissipation factor and, hence, there are limitations on the use of such polyetherimides as insulating materials for high-density multilayered integrated circuits or for circuits for high-speed high-frequency use because of the performances thereof. Techniques for compensating for such electrical properties of polyetherimides are hence known, which include a technique in which a poly(phenylene ether), which has a low relative permittivity and relatively excellent electrical properties although poor in mechanical strength, moldability and heat resistance, is blended with a polyetherimide (see, for example, Patent Document 2 specified below) and a technique in which an aromatic vinyl compound is blended as a crosslinking ingredient with a polyetherimide (see, for example, patent document 3 specified below). However, the polymers used in these polymer blends are mostly incompatible with the polyetherimides and, hence, the polymer blends obtained have not been sufficiently improved in mechanical properties and heat resistance.

Namely, no polyimide resin has been known which has all of a low relative permittivity, low dielectric dissipation factor and high heat resistance, and is hence suitable for use as an insulating material in wiring circuit boards for electronic appliances operated at high frequencies.

Patent Document 1: JP 2001-151935 A
Patent Document 2: JP 05-179140 A
Patent Document 3: JP 05-156159 A

SUMMARY OF THE INVENTION

The invention has been achieved in order to overcome the above-described problems associated with the use of polyimide resins as electrical insulating materials.

Accordingly, an object of the invention is to provide a polyimide resin for electrical insulating material use which has all of, in particular, a low relative permittivity, low dielectric dissipation factor and high heat resistance, and is hence suitable for use as an insulating material in wiring circuit boards for electronic appliances operated at high frequencies.

Other objects and effects of the invention will be apparent from the following description.

The invention provides a polyimide resin for electrical insulating materials which comprises a polyimide resin having a repeating unit represented by general formula (I):

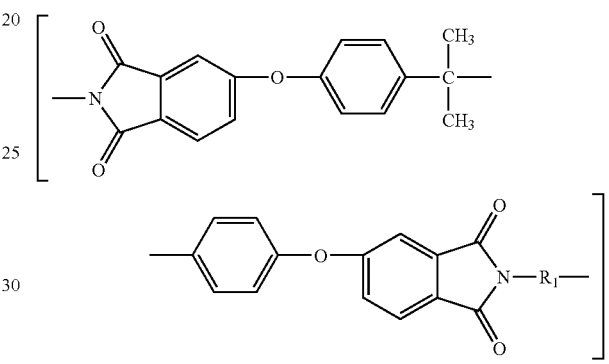

wherein $R_1$ represents a bivalent organic group.

The polyimide resin for electrical insulating materials according to the invention has a low relative permittivity and a low dielectric dissipation factor, i.e., has a relative permittivity at 1 MHz of 3.0 or lower and a dielectric dissipation factor at 1 MHz of 0.003 or lower, and is hence suitable for use in forming an insulating layer reduced in dielectric loss in a high-frequency region.

DETAILED DESCRIPTION OF THE INVENTION

The polyimide resin for electrical insulating materials according to the invention has a repeating unit represented by general formula (I):

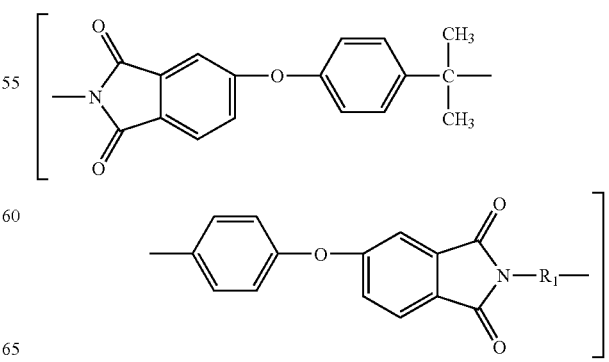

wherein $R_1$ represents a bivalent organic group.

In particular, in the polyimide resin having a repeating unit represented by general formula (I) according to the invention, the bivalent organic group $R_1$ preferably is one represented by general formula (II):

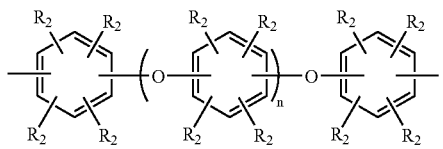

wherein $R_2$'s each independently represent a hydrogen atom, a halogen atom, or a hydrocarbon group, and n represents an integer of 1 to 5, or formula (III):

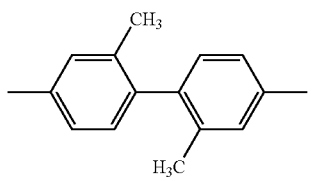

or formula (IV):

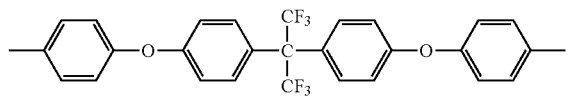

Such a polyimide resin can be obtained by reacting 2,2-bis[4-(3,4-dicarboxyphenoxy)phenyl]propane dianhydride (BSAA), which is represented by the following formula (V):

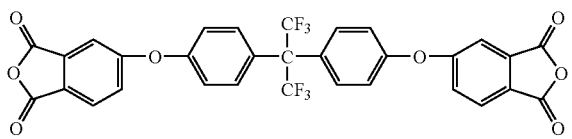

with a diamine represented by general formula (VI):

wherein $R_1$ is the same as defined above, to obtain a poly(amic acid) represented by general formula (VII):

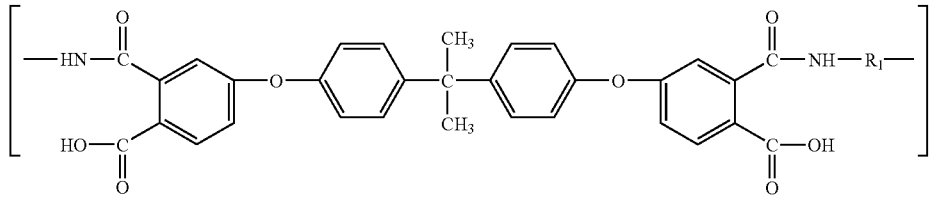

wherein $R_1$ is the same as defined above, and then imidizing the poly(amic acid).

The bivalent group $R_1$ in the polyimide resin represented by general formula (I) is a residue of the diamine represented by general formula (VI) used in preparing the poly(amic acid) (i.e., the bivalent group formed by removing the two amino groups from the diamine structure). Namely, according to the invention, a polyimide resin having a low relative permittivity and a low dielectric dissipation factor can be obtained by using a diamine having the bivalent group $R_1$. In addition, the diamine having the bivalent group $R_1$ can be advantageously used also because of its high reactivity.

In the case where the bivalent group $R_1$ is a bivalent group represented by general formula (II), examples of $R_2$ are as follows. When $R_2$ is a halogen atom, preferred examples thereof include chlorine and bromine atoms. When $R_2$ is a hydrocarbon group, preferred examples thereof include alkyl groups such as methyl, ethyl and propyl, aryl groups such as phenyl and naphthyl, and arylalkyl groups such as benzyl. The symbol n preferably is an integer of 1 to 3.

Consequently, examples of the diamine having the bivalent group $R_1$ include 1,4-bis(4-aminophenoxy)benzene, 1,4-bis(3-aminophenoxy)benzene, 1,3-bis(4-aminophenoxy)benzene, 1,3-bis(3-aminophenoxy)benzene, 1,3-bis(3-(3-aminophenoxy)phenoxy)benzene, 2,2'-dimethyl-4,4'-diaminobiphenyl, and 2,2-bis(4-(4-aminophenoxy)phenyl)-1,1,1,3,3,3-hexafluoropropane.

The poly(amic acid) can be obtained usually as a solution by reacting 2,2-bis[4-(3,4-dicarboxyphenoxy)phenyl]propane dianhydride (BSAA) with the diamine preferably in an organic solvent. The reaction between 2,2-bis[4-(3,4-dicarboxyphenoxy)phenyl]propane dianhydride (BSAA) and the diamine is usually conducted at ordinary pressure and a temperature of 100° C. or lower, preferably 80° C. or lower. The reaction time varies depending on the diamine to be used and on the solvent and reaction temperature, but is generally in the range of from 4 to 24 hours. The poly(amic acid) thus obtained has a number-average molecular weight of generally from 1,000 to 100,000, preferably from 5,000 to 50,000.

Examples of the organic solvent include N,N-dimethylformamide, N,N-dimethylacetamide, N-methyl-2-pyrrolidone, and 1,3-dimethyl-2-imidazolidinone. However, the organic solvent to be used should not be construed as being limited to these examples.

For forming an insulating layer comprising the polyimide resin according to the invention from the poly(amic acid) solution thus obtained, use may be made of a method which comprises applying the poly(amic acid) solution to an appropriate substrate, subsequently drying the solution to form a coating film, and then heating the coating film to imidize the polymer and thereby form a coating film made of a polyimide resin. The heating temperature for such imidization of poly(amic acid) is in the range of generally from 100 to 450° C., preferably from 130 to 400° C.

The polyimide resin for electrical insulating materials according to the invention is suitable for use in, e.g., forming insulating layers in wiring circuit boards. Although the wiring circuit boards are not particularly limited, examples thereof include wiring circuit boards and multilayered wiring circuit boards in electrical/electronic appliances, such as flexible wiring circuit boards and circuit-bearing suspension boards. The polyimide resin according to the invention can be advantageously used for forming various insulating layers, such as insulating base layers and insulating cover layers in such wiring circuit boards and interlayer dielectrics in multilayered wiring circuit boards. It should, however, be noted that uses of the polyimide resin of the invention as an electrical insulating material are not particularly limited.

EXAMPLES

The present invention will be illustrated in greater detail with reference to the following Examples and Comparative Examples, but the invention should not be construed as being limited thereto.

Example 1

Into a four-necked separable flask having a capacity of 500 mL were introduced 16.08 g (55 mmol) of 1,4-bis(4-aminophenoxy)benzene, 28.63 g (55 mmol) of 2,2-bis[4-(3,4-dicarboxyphenoxy)phenyl]propane dianhydride (BSAA), and 178.82 g of N,N-dimethylacetamide. The resultant mixture was stirred at room temperature for 24 hours to obtain an N,N-dimethylacetamide solution of a poly(amic acid).

This N,N-dimethylacetamide solution of a poly(amic acid) was cast on a glass plate with an applicator. In a circulating hot-air drying oven, the solution applied was heated at 300° C. for 2 hours and then at 380° C. for 30 minutes in an air atmosphere to imidize the poly(amic acid). Thus, a polyimide resin film was obtained. This film was peeled from the glass plate and subjected to measurements of relative permittivity, dielectric dissipation factor, and glass transition point by the methods described below (the same applies hereinafter).

Example 2

A polyimide resin film was obtained in the same manner as in Example 1, except that 1,4-bis(3-aminophenoxy)benzene was used as the diamine.

Example 3

A polyimide resin film was obtained in the same manner as in Example 1, except that 2,2-bis(4-(4-aminophenoxy)phenyl-1,1,1,3,3,3-hexafluoropropane was used as the diamine.

Example 4

A polyimide resin film was obtained in the same manner as in Example 1, except that 1,3-bis(4-aminophenoxy)benzene was used as the diamine.

Example 5

A polyimide resin film was obtained in the same manner as in Example 1, except that 2,2'-dimethyl-4,4'-diaminobiphenyl was used as the diamine.

Example 6

A polyimide resin film was obtained in the same manner as in Example 1, except that 1,3-bis(3-aminophenoxy)benzene was used as the diamine.

Example 7

A polyimide resin film was obtained in the same manner as in Example 1, except that 1,3-bis(3-(3-aminophenoxy)phenoxy)benzene was used as the diamine.

Comparative Example 1

A polyimide resin film was obtained in the same manner as in Example 1, except that m-phenylenediamine was used as the diamine.

Comparative Example 2

A polyimide resin film was obtained in the same manner as in Example 1, except that biphenyltetracarboxylic dianhydride was used as the acid dianhydride.

The relative permittivities, dielectric dissipation factors and glass transition points of the polyimide resin films obtained in Examples 1 to 7 and Comparative Examples 1 and 2 are shown in Table 1.

TABLE 1

| | Glass transition point (° C.) | Relative permittivity | | Dielectric dissipation factor | |
|---|---|---|---|---|---|
| | | 1 MHz | 10 GHz | 1 MHz | 10 GHz |
| Example 1 | 161 | 2.74 | 2.61 | 0.0008 | 0.0024 |
| Example 2 | 202 | 2.74 | 2.63 | 0.0011 | 0.0031 |
| Example 3 | 207 | 2.72 | 2.59 | 0.0012 | 0.0037 |
| Example 4 | 191 | 2.82 | 2.69 | 0.0021 | 0.0062 |
| Example 5 | 229 | 2.50 | 2.37 | 0.0008 | 0.0025 |
| Example 6 | 161 | 2.56 | 2.35 | 0.0010 | 0.0030 |
| Example 7 | 133 | 2.83 | 2.64 | 0.0024 | 0.0050 |
| Comp. Ex. 1 | 214 | 3.68 | 3.55 | 0.0035 | 0.0105 |
| Comp. Ex. 2 | 257 | 3.32 | 3.19 | 0.0031 | 0.0090 |

The relative permittivity, dielectric dissipation factor and glass transition point of each polyimide resin film were measured in the following manners.

Measurements of Relative Permittivity and Dielectric Dissipation Factor:

Using dielectric analyzer HP16451B, manufactured by Yokogawa-Hewlett-Packard, Ltd., relative permittivity and dielectric dissipation factor were measured at 1 MHz. Furthermore, vector network analyzer HP8753D/E, manufactured by Kanto Electronics Application and Development Inc., was used to measure relative permittivity and dielectric dissipation factor at 10 GHz.

Measurement of Glass Transition Point:

Using TMA/SS100, manufactured by Seiko Instruments Inc., the polyimide resin film was heated from 30° C. to 400° C. at a rate of 10° C./min to measure the glass transition point with respect to the machine direction.

While the present invention has been described in detail and with reference to specific embodiments thereof, it will be apparent to one skilled in the art that various changes and modifications can be made therein without departing from the spirit and scope thereof.

The present application is based on Japanese patent application Nos. 2003-191898 (filed Jul. 4, 2003) and 2004-118715 (filed Apr. 14, 2004), the contents thereof being herein incorporated by reference.

What is claimed is:

1. A polyimide resin for an electrical insulating material which comprises a polyimide resin having a repeating unit represented by general formula (I):

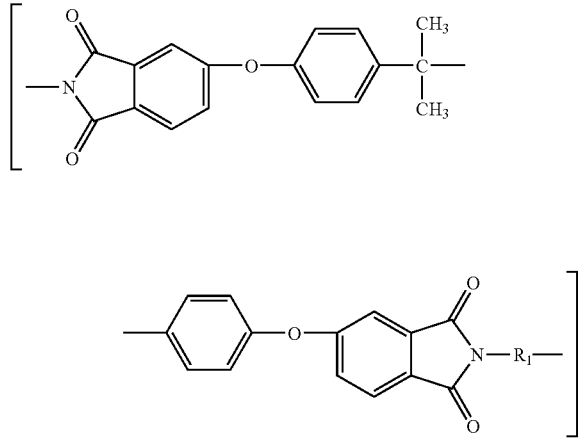

wherein $R_1$ represents a bivalent organic group represented by general formula (II)

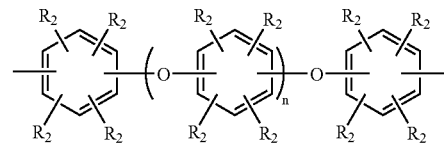

wherein $R_2$'s each independently represent a hydrogen atom, a halogen atom or a hydrocarbon group, and n represents an integer of 1 to 5, or formula (III)

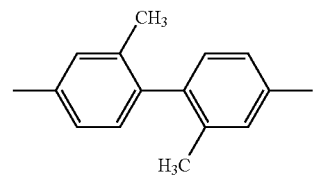

or formula (IV)

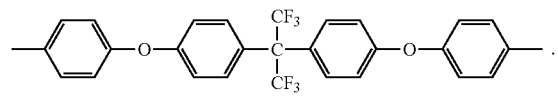

2. The polyimide resin of claim 1, wherein $R_1$ is represented by general formula (II).

3. The polyimide resin of claim 1, wherein $R_1$ is represented by formula (III).

4. The polyimide resin of claim 1, wherein $R_1$ is represented by general formula (IV).

5. The polyimide resin of claim 1, having a number-average molecular weight of from 1,000 to 100,000.

6. The polyimide resin of claim 1, having a number-average molecular weight of from 5,000 to 50,000.

* * * * *